United States Patent [19]
Nakashiba

[11] Patent Number: 5,340,766
[45] Date of Patent: Aug. 23, 1994

[54] METHOD FOR FABRICATING CHARGE-COUPLED DEVICE

[75] Inventor: Yasutaka Nakashiba, Tokyo, Japan

[73] Assignee: NEC Corporation, Japan

[21] Appl. No.: 32,147

[22] Filed: Mar. 17, 1993

[30] Foreign Application Priority Data

Mar. 19, 1992 [JP] Japan ................. 4-093713

[51] Int. Cl.$^5$ ......................................... H01L 21/339
[52] U.S. Cl. ......................................... 437/53; 437/2; 437/74
[58] Field of Search ............... 437/2, 50, 53, 74, 63, 437/64

[56] References Cited

U.S. PATENT DOCUMENTS

| | | | |
|---|---|---|---|
| 4,216,574 | 8/1980 | Feist ............................. | 437/74 |
| 4,276,099 | 6/1981 | Keen et al. ..................... | 437/53 |
| 4,608,749 | 9/1986 | Harada et al. .................. | 437/53 |
| 4,683,637 | 8/1987 | Varker et al. .................. | 437/63 |
| 5,246,875 | 9/1993 | Shinji et al. ................... | 437/2 |

*Primary Examiner*—Brian E. Hearn
*Assistant Examiner*—Chandra Chaudhari
*Attorney, Agent, or Firm*—Laff, Whitesel, Conte & Saret

[57] ABSTRACT

A method for fabricating a charge-coupled device includes the steps of forming a photoelectric conversion region and a charge transfer region within a surface region of a semiconductor region of a first conductivity type by introducing impurities of a second conductivity type, an element isolation region by introducing impurities of the first conductivity type. The element isolation region defines the photoelectric conversion region and the charge transfer region and also defines a charge-read-out gate region. The impurities of the first conductivity type are introduced by using a mask pattern which allows a uniform channel width at the charge transfer region. The mask pattern takes into account the lateral diffusion which develops during the thermal process applied after the formation of the element isolation region and is thus set back from the edge line of the charge transfer region. The uniform channel width at the charge transfer region suppresses the occurrence of potential dips caused by narrow channel effects so that efficiency of charge transfer is enhanced.

3 Claims, 4 Drawing Sheets

METHOD FOR FABRICATING CHARGE-COUPLED DEVICE

BACKGROUND OF THE INVENTION (1) Field of the Invention

The present invention relates to a method for fabricating a charge-coupled device, and more particularly to a method for forming an element isolation region in cell portions of the charge-coupled device.

(2) Description of the Related Art

Plan views of a conventional charge-coupled device are given in FIGS. 1A, 1B and 1C, and sectional views thereof taken along the lines A—A in FIGS. 1A(a), 1B(a) and 1C(a) are given in FIGS. 1A(b), 1B(b) and 1C(b), respectively, for illustrating sequential steps for fabricating such a charge-coupled device. A plan view and a potential profile diagram of the charge-coupled device thus formed are given in FIGS. 2A and 2B, respectively.

First, a p-type well 2 is formed on an n-type semiconductor substrate 1. An n-type region 3 to serve as a photoelectric conversion region and an n-type region 4 to serve as a charge transfer region are formed within a surface region of the p-type well 2 by selectively introducing n-type impurities. (see FIGS. 1A(a) and 1A(b))

Next, a p$^+$-type region 5 is formed selectively within the p-type well 2 by highly doping with p-type impurities, thus defining the n-type region 3 and the n-type region 4. (see FIGS. 1B(a) and 1B(b))

Then, charge transfer electrodes 7 and 8 are formed on an insulating film 6 and, thereafter, an interlayer insulating film and a metal wiring are formed, whereby a conventional charge-coupled device is completed. (see FIGS. 1C(a) and 1C(b))

In the conventional fabrication method for the charge-coupled device explained above, diffusion develops laterally in the highly doped p$^+$-type region 5 shown in solid lines in FIG. 2A due to the effect of the thermal process which takes place subsequent to the formation of the p$^+$-type region 5 to serve as an element isolation region. A diffusion region 10 as shown in dash lines is formed after the completion of this process. An adverse consequence therefrom is that, since the charge transfer region at a portion adjacent to a charge-read-out gate region 9 has a wide channel width W$_1$ and that at the remaining portion has a narrow channel width W$_2$, there develops a potential dip $\Delta\phi_{ch}$, as illustrated in FIG. 2B (a potential profile at a plane of cross-section taken along the line B—B in FIG. 2A), which is caused by narrow channel effects during the electron-charge transferring. This potential dip deteriorates the efficiency of the charge transfer. This is a problem to be solved by the invention, in the conventional fabricating method for the charge-coupled device.

SUMMARY OF THE INVENTION

It is, therefore, an object of the present invention to provide a method for fabricating a charge-coupled device which overcomes the problems existing in the conventional method of the kind to which the present invention relates, and to provide an improved method for fabricating a charge-coupled device in which the uniform channel width at a charge transfer region effectively suppresses the occurrence of potential dips caused by narrow channel effects so that efficiency of charge transfer is enhanced.

According to one aspect of the invention, there is provided a method for fabricating a charge-coupled device, comprising the steps of:

forming a photoelectric conversion region and a charge transfer region within a semiconductor layer of a first conductivity type by introducing impurities of a second conductivity type;

forming an element isolation region by introducing impurities of the first conductivity type into the semiconductor layer by using a mask pattern, the element isolation region defining the photoelectric conversion region and the charge transfer region and also defining a charge-read-out gate region for reading out a signal charge to the charge transfer region from the photoelectron conversion region, and the mask pattern for introducing the impurities of the first conductivity type being set back from an edge line of the charge transfer region which edge line is at a side of the charge-read-out gate region.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments according to the invention are explained with reference to the accompanying drawings. It is to be noted that, throughout the following explanation, similar reference symbols or numerals refer to the same or similar elements in all the figures of the drawings.

Figure 3A:
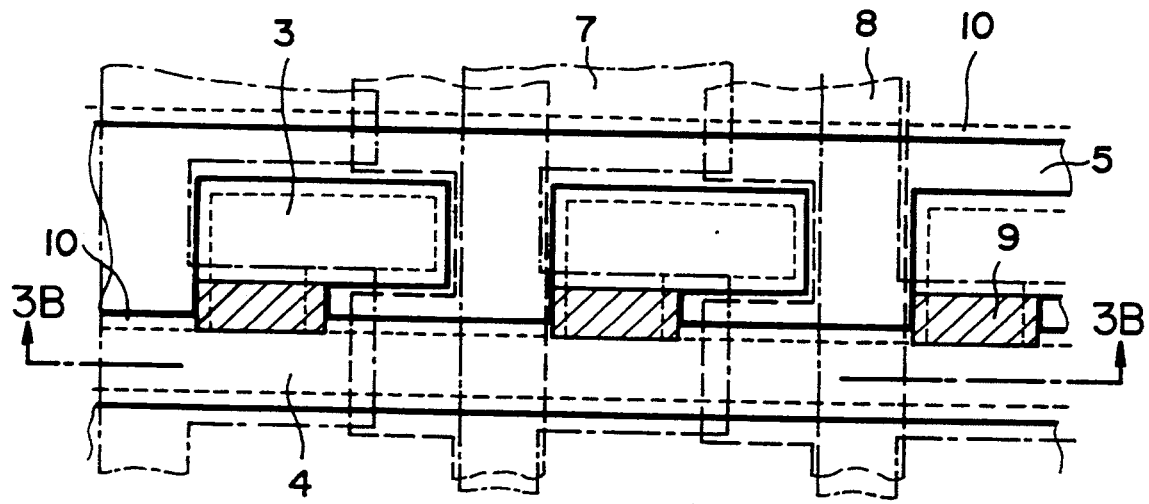
FIG. 3A is a plan view of a charge-coupled device fabricated according to a first embodiment of the invention and FIG. 3B is a diagram showing a potential profile at a cross-sectional plane taken along the line C—C in FIG. 3A.
Figure 3B:
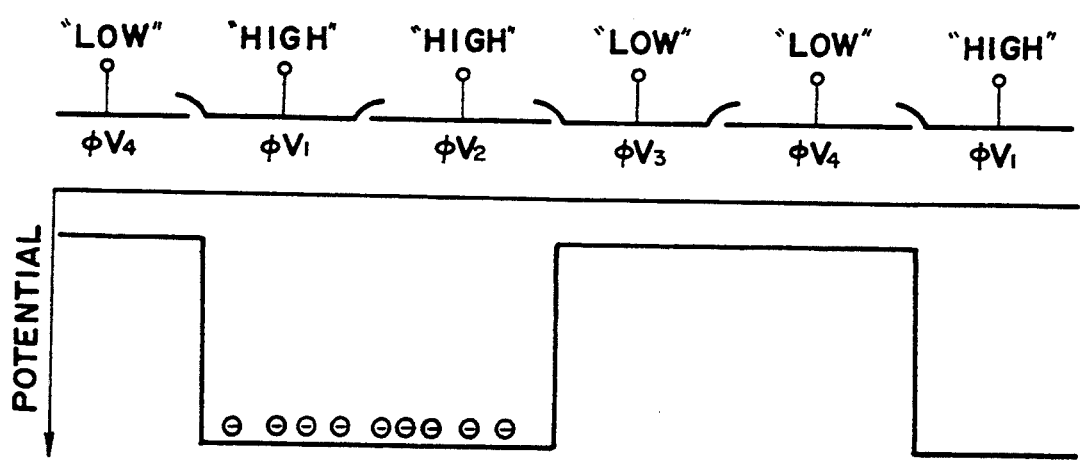

FIG. 3A is a plan view showing a charge-coupled device fabricated according to a first embodiment of the invention and FIG. 3B is a diagram showing a potential profile at a cross-sectional plane taken along the line C—C in FIG. 3A.

In fabricating the charge-coupled device of the first embodiment shown in FIG. 3A, as in the conventional method, n-type regions 3 and 4 are formed within the p-type well and, thereafter, a highly doped p$^+$-type region 5 is formed followed by the formation of charge transfer electrodes 7 and 8. In carrying out the above processes, the mask pattern (the portion shown by thick solid lines in FIG. 3A) used for the formation of the p$^+$-type region 5 has a pattern which takes into account the lateral diffusion which develops during the thermal process applied after the formation of the p+-type region 5 and is thus set back from an edge of the n-type region 4 which serves as the charge transfer region.

Figure 1A:
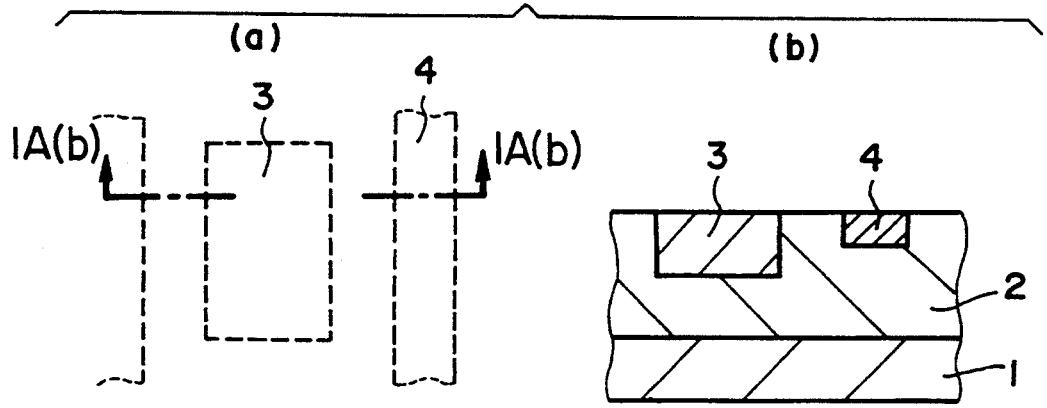
FIGS. 1A, 1B and 1C are plan and sectional views of a conventional charge-coupled device, for explaining sequential fabrication steps therefor.
Figure 1B:
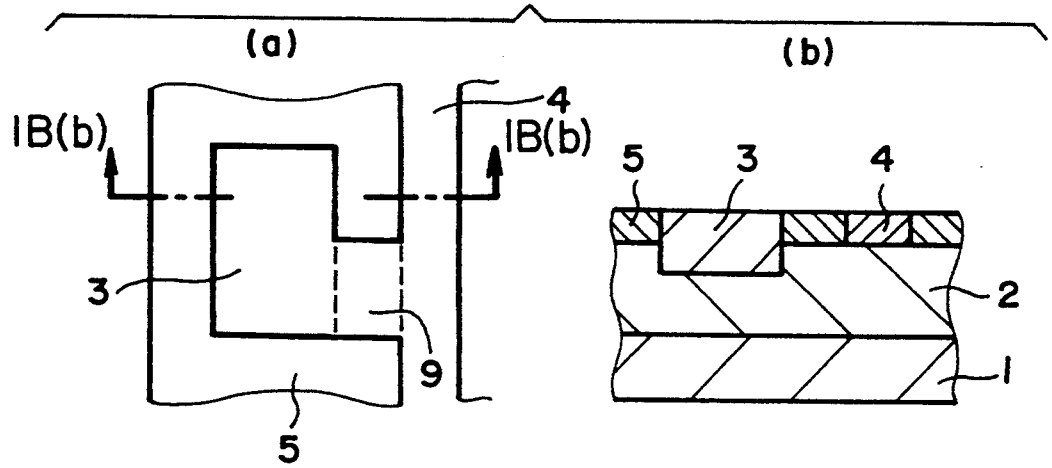
Figure 1C:
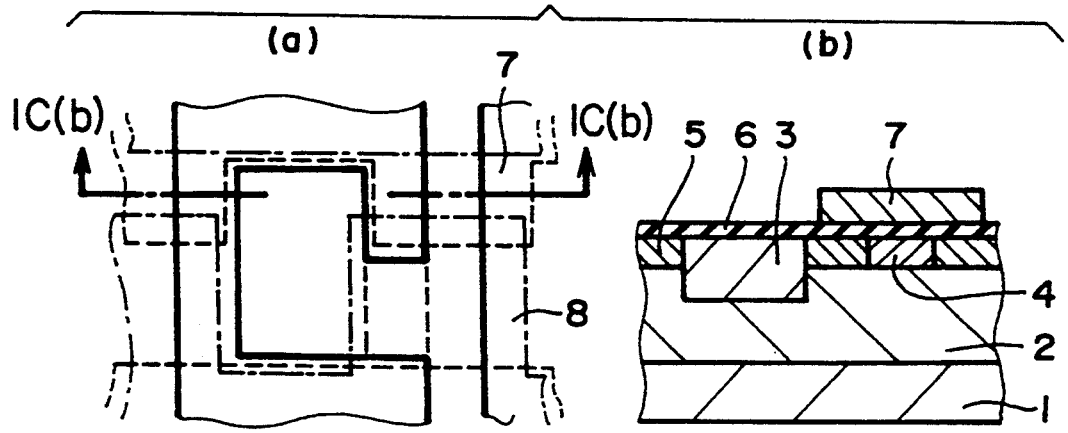
Figure 2A:
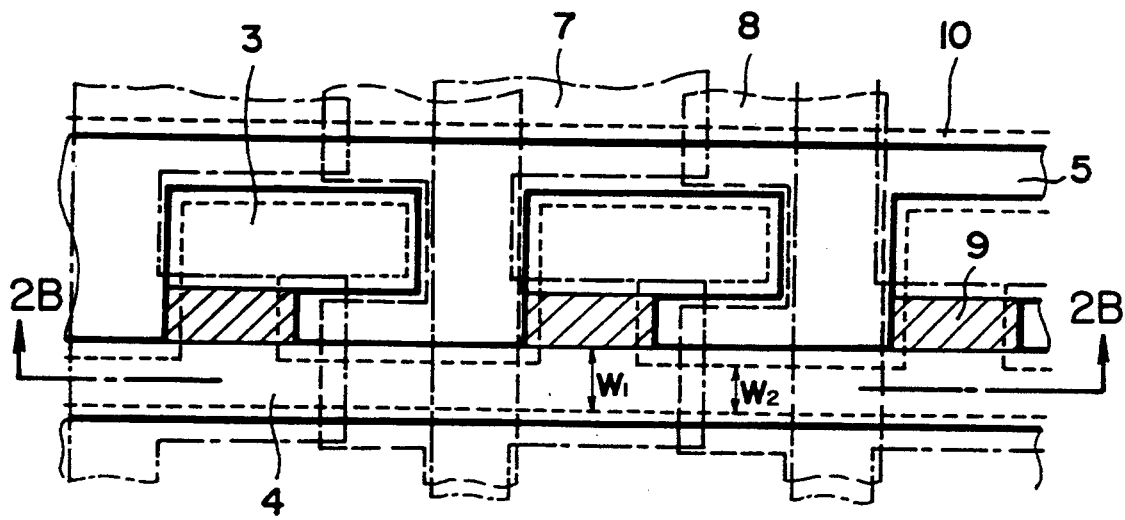
FIG. 2A is a plan view of a conventional charge-coupled device and FIG. 2B is a diagram showing a potential profile at a cross-sectional plane taken along the line B—B in FIG. 2A.
Figure 2B:
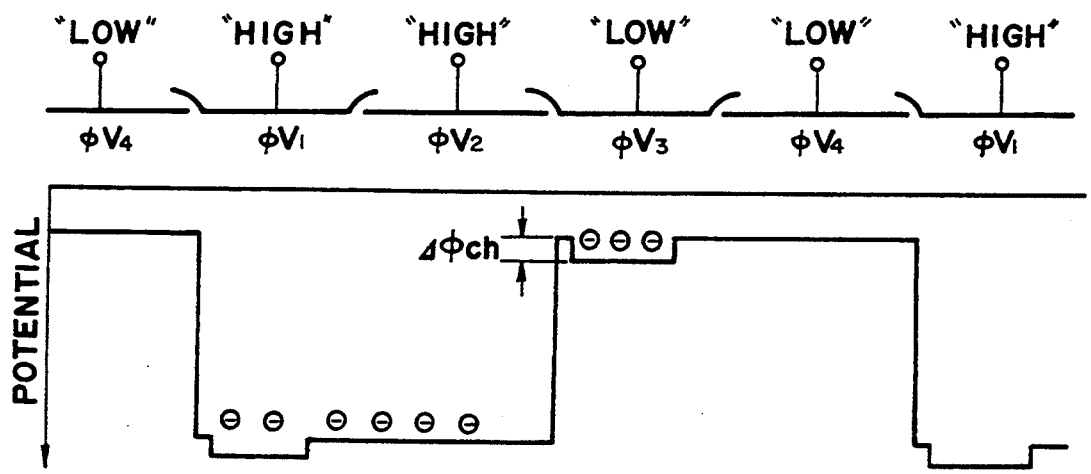

When the thermal process is completed, the diffusion region 10 shown in dash lines outside the p+-type region 5 is formed. However, the front line of the diffusion region 10 coincides with an edge of the charge-read-out gate region 9 at a portion in contact with the charge transfer region (n-type region 4). That is, according to this embodiment, the channel width of the charge transfer region is made the same all the way through so as to suppress the occurrence of potentials dips. As readily understood from the potential profile shown in FIG. 3B, there occurs no potential dip unlike in the prior art as shown in FIG. 2B.

It has been confirmed through an experimental fabrication of the device that, if impurities of $4 \times 10^{12}$ cm$^{-2}$ are introduced to the n-type region 4 to become the charge transfer region and impurities of $2 \times 10^{13}$ cm$^{-2}$ are introduced to the p+-type region 5 to become the element isolation region and the mask pattern is so set as to provide between the former and the latter regions a distance in the order of 0.3 μm, the charge transfer efficiency is enhanced due to the suppression of the occurrence of potential dips.

Figure 4A:
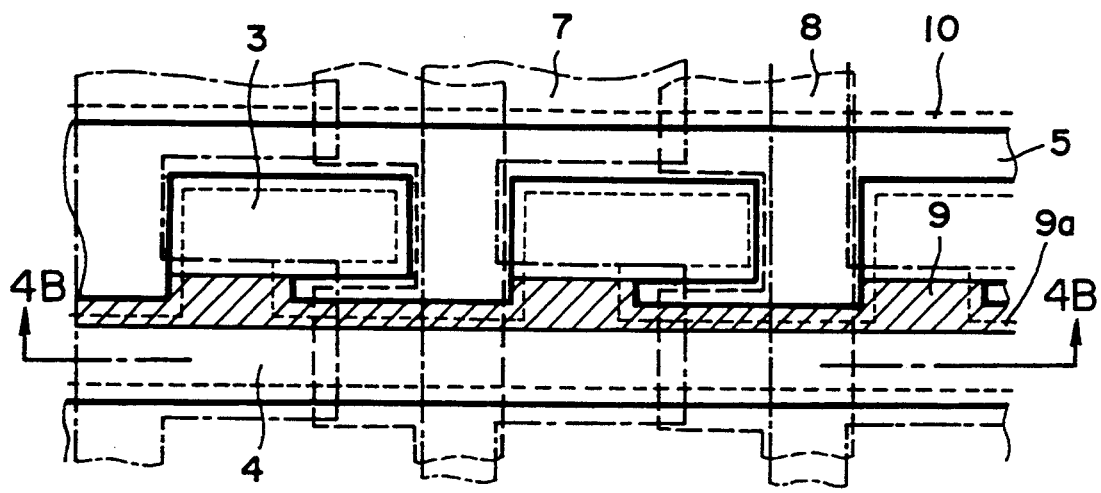
FIG. 4A is a plan view of a charge-coupled device fabricated according to a second embodiment of the invention and FIG. 4B is a diagram showing a potential profile at a cross-sectional plane taken along the line D—D in FIG. 4A.
Figure 4B:
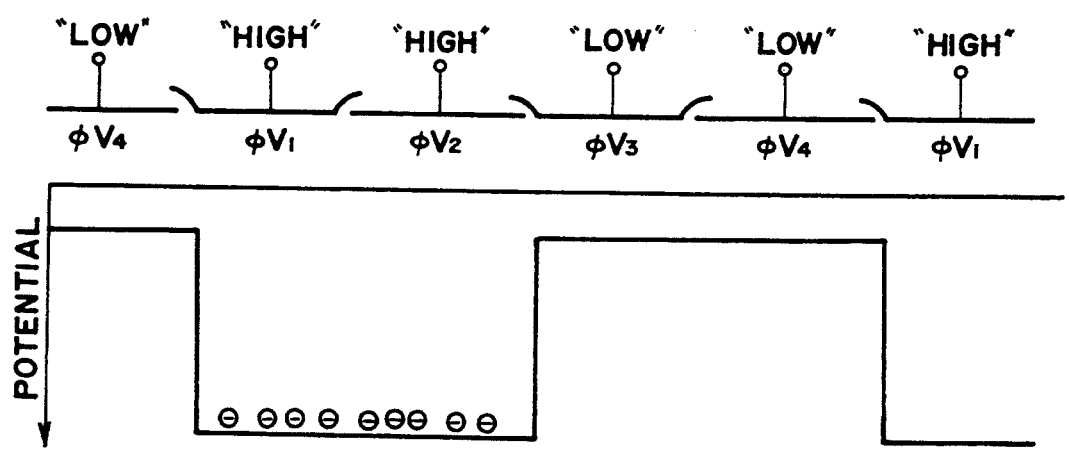

FIG. 4A is a plan view of a charge-coupled device fabricated according to a second embodiment of the invention and FIG. 4B is a diagram showing a potential profile developed at a given time in the section taken along the line D—D in FIG. 4A.

The fabrication processes used for the fabrication of the device are the same as those used in the first embodiment.

In the device fabricated according to this second embodiment, the diffusion front formed when the thermal process of the p+-type region 5 is completed stays within the p-type region 9a which is integrally formed with the gate region 9.

Therefore, in the device thus fabricated, the channel width of the channel transfer region is the same all the way through without the occurrence of a wide portion or a narrow portion.

It has been confirmed through an experimental fabrication of the device that, if impurities of $4 \times 10^{12}$ cm$^{-2}$ are introduced to the n-type region 4 to become the charge transfer region, impurities of $2 \times 10^{13}$ cm$^{-2}$ are introduced to the p+-type region 5 to become the element isolation region and impurities of $2 \times 10^{12}$ cm$^{-2}$ are introduced to the gate region 9 and p-type region 9a and the mask pattern is so set as to provide between the n-type region 4 and the p+-type region 5 a distance greater than 0.4 μm, the charge transfer efficiency is enhanced due to the suppression of the occurrence of potential dips $\Delta\phi_{ch}$ which may be caused by narrow channel effects.

As explained above, in the fabrication method for a charge-coupled device according to the invention, the mask pattern used for the formation of the p+-type region 5 has a pattern which takes into account in advance the lateral diffusion which develops during the thermal process in the p+-type region to become the element isolation region and which maintains a predetermined distance between the p+-type region and the n-type region to become the charge transfer region. Thus, in the device fabricated according to the invention, the channel width of the charge transfer region is uniform which has made it possible to enhance the charge transfer efficiency due to the suppression of the occurrence of potential dips $\Delta\phi_{ch}$ which may be caused by narrow channel effects.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a charge-coupled device, comprising the steps of:

forming a photoelectric conversion region and a charge transfer region within a semiconductor layer of a first conductivity type by introducing impurities of a second conductivity type;

forming an element isolation region by introducing impurities of the first conductivity type into said semiconductor layer by using a mask pattern, said element isolation region defining said photoelectric conversion region and said charge transfer region and also defining a charge-read-out gate region for reading out a signal charge to said charge transfer region from said photoelectron conversion region, and said mask pattern for introducing the impurities of the first conductivity type being set back from an edge line of said charge transfer region which edge line is at a side of the charge-read-out gate region.

2. A method for fabricating a charge-coupled device according to claim 1, in which said first conductivity type is p-type and said second conductivity type is an n-type.

3. A method for fabricating a charge-coupled device according to claim 1, which includes a step of forming a p-type region formed integrally with said charge-read-out gate region and in which the impurities of the first conductivity type are introduced in such a way that a diffusion front of said element isolation region is kept within said p-type region at a side of said charge-read-out gate region of said charge transfer region.

* * * * *